(12) United States Patent
Huang et al.

(10) Patent No.: US 10,775,636 B2
(45) Date of Patent: *Sep. 15, 2020

(54) HIGH BRIGHTNESS, MONOLITHIC, MULTISPECTRAL SEMICONDUCTOR LASER

(71) Applicants: Robin Huang, North Billerica, MA (US); Bien Chann, Merrimack, NH (US); Parviz Tayebati, Sherborn, MA (US); Mike Cruz, Somerville, MA (US)

(72) Inventors: Robin Huang, North Billerica, MA (US); Bien Chann, Merrimack, NH (US); Parviz Tayebati, Sherborn, MA (US); Mike Cruz, Somerville, MA (US)

(73) Assignee: TERADIODE, INC., Wilmington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/561,160

(22) Filed: Sep. 5, 2019

(65) Prior Publication Data

US 2020/0142205 A1 May 7, 2020

Related U.S. Application Data

(63) Continuation of application No. 15/973,792, filed on May 8, 2018, now Pat. No. 10,444,524, which is a continuation of application No. 15/442,004, filed on Feb. 24, 2017, now Pat. No. 9,989,772, which is a continuation of application No. 14/247,233, filed on Apr. 7, 2014, now Pat. No. 9,620,933.

(Continued)

(51) Int. Cl.
*G02B 27/10* (2006.01)
*G02B 27/14* (2006.01)
*G02B 5/04* (2006.01)
*G02B 21/28* (2006.01)
*H01S 5/40* (2006.01)
*H01S 5/00* (2006.01)

(52) U.S. Cl.
CPC ..... *G02B 27/1006* (2013.01); *G02B 27/1086* (2013.01); *G02B 27/14* (2013.01); *H01S 5/4012* (2013.01); *H01S 5/4087* (2013.01); *H01S 5/005* (2013.01); *H01S 5/4025* (2013.01)

(58) Field of Classification Search
CPC .. G02B 27/145; G02B 27/144; G02B 27/143; G02B 27/1013; G02B 27/126; G02B 5/04; G02B 27/0961; G02B 5/06; G02F 1/293; H04N 9/3197
USPC ....... 359/618, 629, 634, 636, 638, 640, 831, 359/299, 624, 245, 241, 244, 288, 305, 359/285, 308, 311–312, 872, 263, 649, 359/846, 129, 496, 631, 639, 833–834, 359/630, 341.3, 341.33, 337.21; 353/31, 353/34, 81
See application file for complete search history.

(56) References Cited

U.S. PATENT DOCUMENTS 9,620,933 B1  4/2017  Huang et al.
9,989,772 B2  6/2018  Huang et al.
(Continued)

*Primary Examiner* — Dawayne Pinkney
(74) *Attorney, Agent, or Firm* — Morgan, Lewis & Bockius LLP

(57) ABSTRACT

A system and method for combining multiple emitters into a multi-wavelength output beam having a certain band and combining a plurality of these bands into a single output using non-free space combining modules.

20 Claims, 5 Drawing Sheets

Related U.S. Application Data

(60) Provisional application No. 61/809,360, filed on Apr. 6, 2013.

(56) References Cited

U.S. PATENT DOCUMENTS

| | | |
|---|---|---|
| 2005/0270775 A1 | 12/2005 | Harbers et al. |
| 2009/0190218 A1 | 7/2009 | Govorkov et al. |
| 2012/0293774 A1 | 11/2012 | Inoue et al. |
| 2017/0160553 A1 | 6/2017 | Huang et al. |
| 2018/0329216 A1 | 11/2018 | Huang et al. |

HIGH BRIGHTNESS, MONOLITHIC, MULTISPECTRAL SEMICONDUCTOR LASER

CROSS-REFERENCE TO RELATED APPLICATIONS

This application is a continuation of U.S. patent application Ser. No. 15/973,792, filed May 8, 2018, which is a continuation of U.S. patent application Ser. No. 15/442,004, filed Feb. 24, 2017, which is a continuation of U.S. patent application Ser. No. 14/247,233, filed Apr. 7, 2014, which claims the benefit of and priority to U.S. Provisional Patent Application No. 61/809,360, filed Apr. 6, 2013, the entire disclosure of each of which is hereby incorporated by reference herein.

BACKGROUND OF THE INVENTION

1. Field of the Invention

The present embodiments relate generally to laser systems and more particularly to non-free space multiband laser system.

2. Description of the Prior Art

WBC methods have been developed to combine beams along a combining dimension and produce a high power multi-wavelength output.

However, a need exists for a non-free space multi-band system that may be combined with several multi-band beams to form a multi-broadband laser output.

The following application seeks to solve the problems stated.

SUMMARY OF THE INVENTION

A multi-broadband beam non-free space combiner comprising: a plurality of beam combining modules each comprising: a plurality of external facets along the outside portion of a non-free space combining module, wherein at least one input facet is configured to receive a plurality of input optical beams; a plurality of optical modifying surfaces contained within the beam combining module including at least one beam converging surface, a diffraction surface, and a partially reflective surface, wherein beam converging surface is configured to receive the input optical beams and combine them substantially near the diffraction surface, wherein the diffraction surface receives the combined beams and transmits a multi-wavelength beam onto a partially-reflective surface, and wherein the partially-reflective receives the multi-wavelength beam, reflects a portion of the combined beams back to the diffraction surface, and transmits the multi-wavelength beam; at least one dichroic combiner comprising: at least two input facets configured to receive multi-wavelength beams, wherein one of the input facets is coated to internally reflect a first multi-wavelength beam having a first wavelength band and transmit a second multi-wavelength beam having a second wavelength band, wherein the first-reflected and second-transmitted multi-wavelengths beams are combined into a co-bore sighted multi-band beam, and an output surface configured to transmit the multi-band beam.

The multi-broadband beam non-free space combiner above, wherein the beam combining modules and dichroic combiner are juxtaposed in a manner that input beams forming the multi-band beam are contained entirely in a non-free space medium.

The multi-broadband beam non-free space combiner above, wherein the beam combining module is comprised of a material from the group consisting: solid glass, fused silica, UV-grade sapphire, CaF2, MgF2, and ZnSe.

The multi-broadband beam non-free space combiner above, further including a plurality of dichroic combiners.

The multi-broadband beam non-free space combiner above, wherein the beam combiner module further includes an internal reflecting surface.

The multi-broadband beam non-free space combiner above, wherein the input beams are provided by a semiconductor lasing source.

The multi-broadband beam non-free space combiner above, wherein the semiconductor lasing is abutted next to the input facet.

The multi-broadband beam non-free space combiner of claim 1, wherein the plurality of combining modules are stacked on top of each other.

A multi-beam non-free space combiner comprising: a beam combining modules comprising: a plurality of external facets formed along the outside portion of a non-free space combining module, wherein at least one facet is configured to receive a plurality of input optical beams; a plurality of optical modifying surfaces at least partially contained within the beam combining module including at least one beam converging surface, a diffraction surface, and a partially reflective surface; wherein the beam converging surface is configured to receive the input optical beams and cause the beams to converge at or substantially near the diffraction surface, wherein the diffraction surface receives the combined beams and transmits a multi-wavelength beam onto a partially-reflective surface, and wherein the partially-reflective receives the multi-wavelength beam, reflects a portion of the combined beams back to the diffraction surface, and transmits the multi-wavelength beam, The multi-beam non-free space combiner above, further comprising a dichroic combiner comprising abutted to the partially reflective surface, such that a continuous non-free space module is formed.

The multi-beam non-free space combiner above, wherein the dichroic combiner is comprised of at least two input facets configured to receive multi-wavelength beams, wherein one of the input facets is coated to internally reflect a first multi-wavelength beam having a first wavelength band and transmit a second multi-wavelength beam having a second wavelength band, wherein the first-reflected and second-transmitted multi-wavelengths beams are combined into a co-bore sighted multi-band beam.

A multi-beam non-free space combiner comprising: a plurality of diode bars mounted on the surface of a combining module, wherein the combining module is non-free space module comprising a plurality of optical surfaces, wherein one of the optical surfaces is an optical lens positioned to cause input beams from the diode bars to converge towards a diffraction surface, wherein the diffraction surface combines the plurality of beams into a multi-wavelength beam that is transmitted onto a partially-reflecting output coupling surface, and wherein a portion of the combined beams are reflected back towards the diffraction grating.

The multi-beam non-free space combiner above, further comprising coupling prisms mounted on the surface of the combining module to receive the input beams from each of the diode bars and transmit said beams into the combining module.

The multi-beam non-free space combiner above, wherein the beam combining module is comprised of a material from the group consisting: solid glass, fused silica, UV-grade sapphire, CaF2, MgF2, and ZnSe.

The multi-beam non-free space combiner above, wherein the beam combining module is mounted to a cooling substrate.

DETAILED DESCRIPTION OF THE PREFERRED EMBODIMENT

For purposes of this application optical elements may refer to any of lenses, mirrors, prisms and the like which redirect, reflect, bend, or in any other manner optically manipulate electromagnetic radiation. Additionally, the term beam includes visible light, infrared radiation, ultra-violet radiation, and electromagnetic radiation. Emitters include any beam-generating device such as semiconductor elements, which generate a beam, but may or may not be self-resonating. These also include fiber lasers, disk lasers, non-solid state lasers and so forth. Generally each emitter is comprised of at least one gain element. For example, a diode element is configured to produce a beam and has a gain element, which may be incorporated into a resonating system.

It should also be understand that certain emitters mentioned in embodiments below, such as a diode element, may be interchanged with other types of beam emitters.

Figure 1:
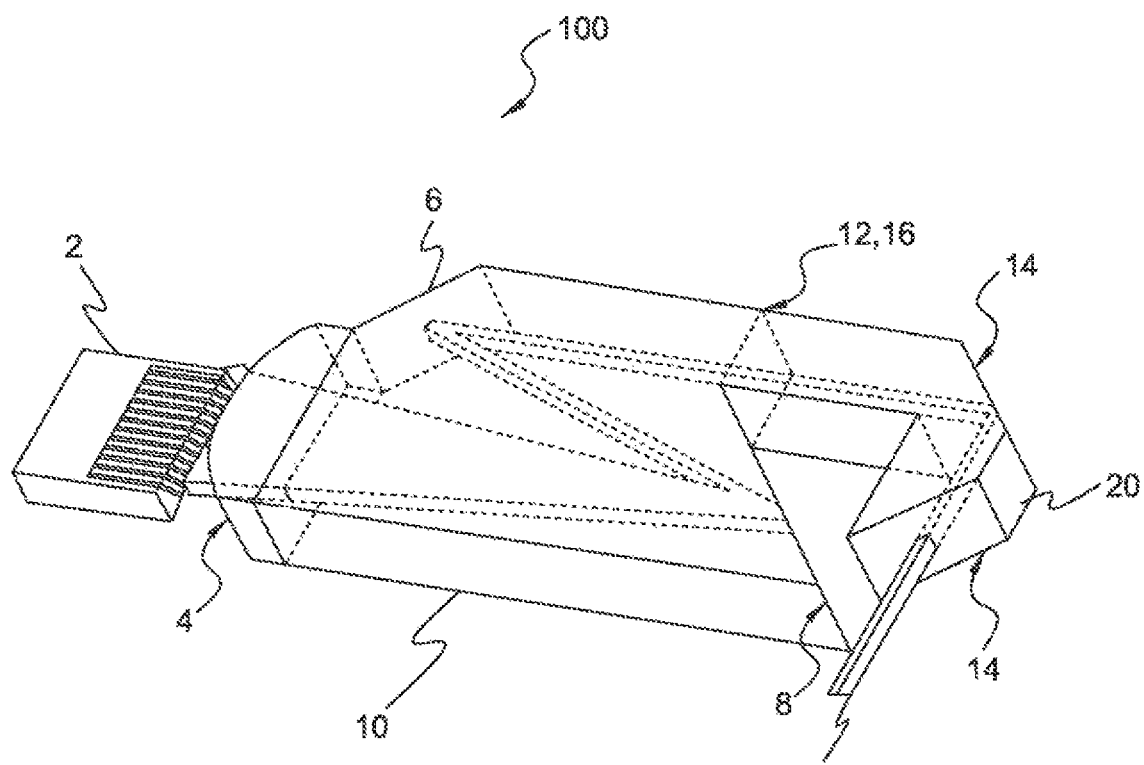
FIG. 1 illustrates a non-free space WBC module.

FIG. 1 shows a non-free space WBC system 100. An array of laser elements 2, which could be a single diode bar, provides an input into combining module 10 at an input surface that also provides a combining optic 4 that is configured to cause each of the input beams to converge towards another optical surface 8, which has a grating formed therein. The grating causes the beams to combine into a multi-wavelength beam similar to other WBC systems. Here the combined multi-wavelength beam is reflected off a reflective surface 6, to help provide a compact design and then onto a partially-reflective output coupler surface 12. A portion of the combined multi-wavelength beam is reflected back towards the grating 8 and back into each of the array of emitters. This results in stabilizing each emitter to a specific wavelength. An input surface 16 of a dichroic combiner 20 receives the combined and directs it towards a dichroic reflecting surface 14. Each dichroic reflective surface is configured to reflect a certain band of wavelengths while transmitting other bands of wavelengths. The resulting system 100 produces a multi-wavelength output beam 25 that may be combined with other systems.

Figure 2:
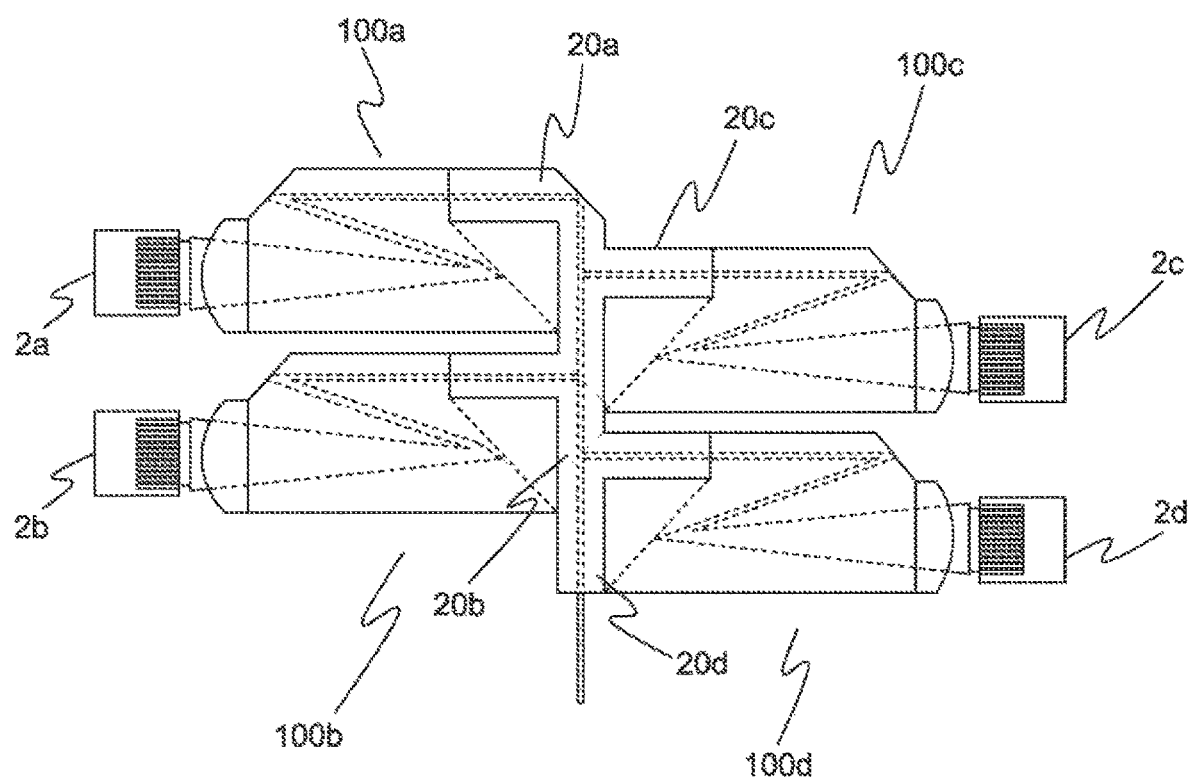
FIG. 2 illustrates a plurality of non-free space WBC modules configured to produce a multi-broad band output beam.

For example, the multi-broad beam combining system 200 of FIG. 2 combines four non-free space WBC systems 100a-d. Each system has an array of emitters 2a-d with accompanying gratings 8a-d that each produce a unique multi-wavelength band of beams. Each of these bands is then combined within the dichroic combiners 20a-d to produce a multi-band output. For example, one band could be in the visible (VIS) or ultraviolet (UV) spectrum, another band could near infrared (NIR), another band could be mid infrared (MWIR), and another could be long infrared band (LWIR). Additionally, it is contemplated a variety of bands in between and of various bandwidths may be used.

As mentioned each combining module may have a distinct wavelength characteristic to produce the desired multi-wavelength output band (beams). Wavelength beam combining can be applied to any laser with a gain bandwidth. For example, these lasers may include diode lasers, fiber lasers, CO2 lasers, and/or Quantum Cascade Lasers (QCLs).

Wavelength beam combining (WBC) is an incoherent process and, thus, does not require phasing of laser elements. In some embodiments, the brightness of the output beam 25 scales proportionally to the total number of laser elements. The output beam 25 of a WBC system is that of a single beam. In both coherent and WBC systems, the output beam quality is the same as that of a single emitter but the output power scales the power from all the laser elements. If both very high spectral brightness (single frequency operation) and very high spatial brightness (single spatial mode) is required then coherent beam combination is the only method. However, in many cases single frequency operation is not desired and may be detrimental to the functionality of the system, thus making WBC the preferred approach.

Figure 3:
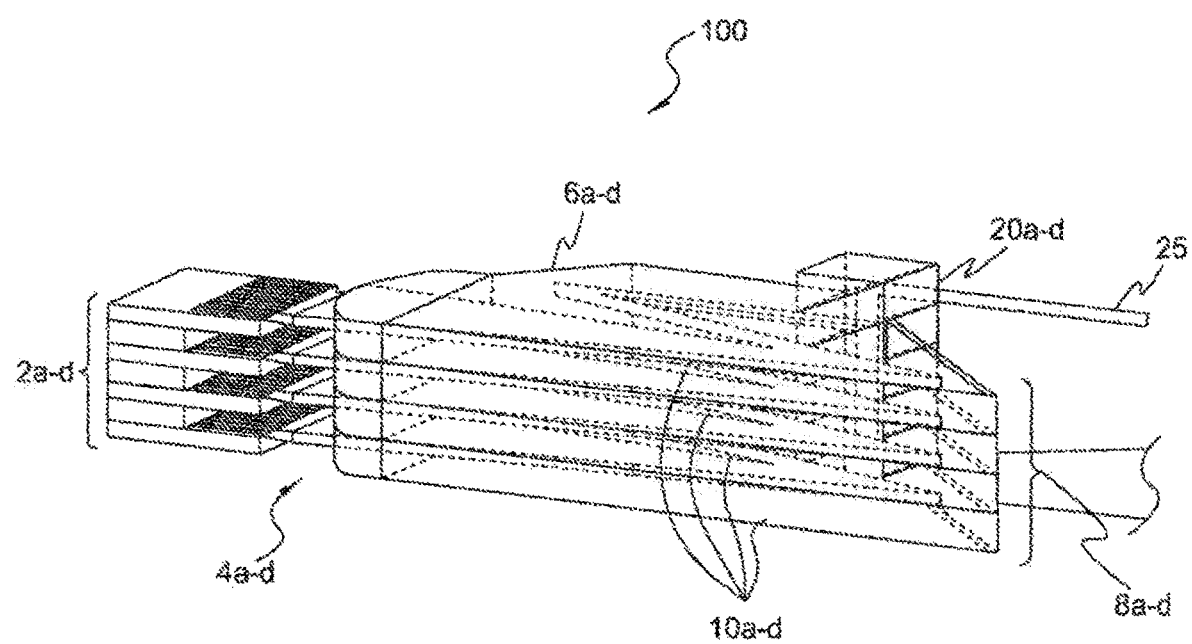
FIG. 3 illustrates a plurality of stacked non-free space WBC modules configured to produce a multi-broad band output beam.

FIG. 3 illustrates another multi-broad beam combining system 300 where instead of a planar combined system the combining modules 10a-d are stacked. Similarly the array of input emitters 2a-d may likewise be stacked and share in series or parallel power. Grating 8a-d formed on one of the outer surfaces of combining module 10a-d may be individually formed on each module as shown, or some instances formed as a single surface. Combining modules 10a-d may also be initially formed as a single unit or later stacked and combined to form a single non-free space combining system 300. The positioning of the dichroic combiners 20a-d becomes more vertically integrated, but functions similarly to 200 to produce a multi-wavelength output beam 25 having a plurality of bands.

Figure 4:
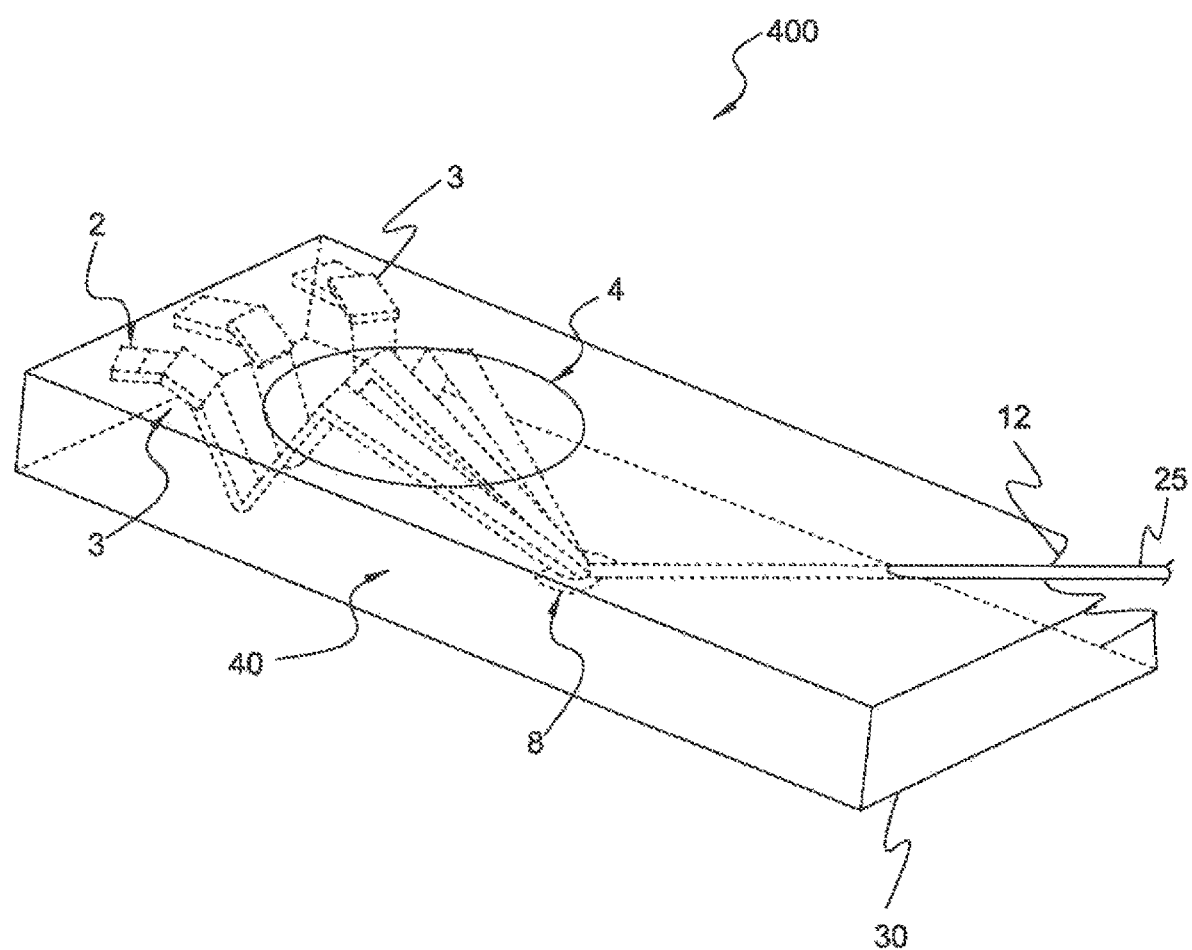
FIG. 4 illustrates a non-free space WBC module having multiple diode bar inputs.

An alternative non-free space system 400 to that of a stacking or planar modular combining system is illustrated in FIG. 4. Here multiple arrays of emitters 2 are mounted on the surface of a combining module 30. Coupling prisms receive the input beams and internally reflect the beams toward an optically mounted or surface formed combing optic that causes the beams to converge towards a grating 8, which may be a diffraction or volume Bragg grating and combines the beams again into a multi-wavelength beam output that is transmitted onto the partially reflecting output coupler 12. This combining module 30 may be mounted to a cooling surface 40. System 400 may be combined with other systems similar to 200 or 300 using dichroic combiners to scale power and output bands. Here it is shown that no free-space exists between the array of emitters 2 and coupling prism 3 as the beams are directly coupled into the system.

Figure 5:
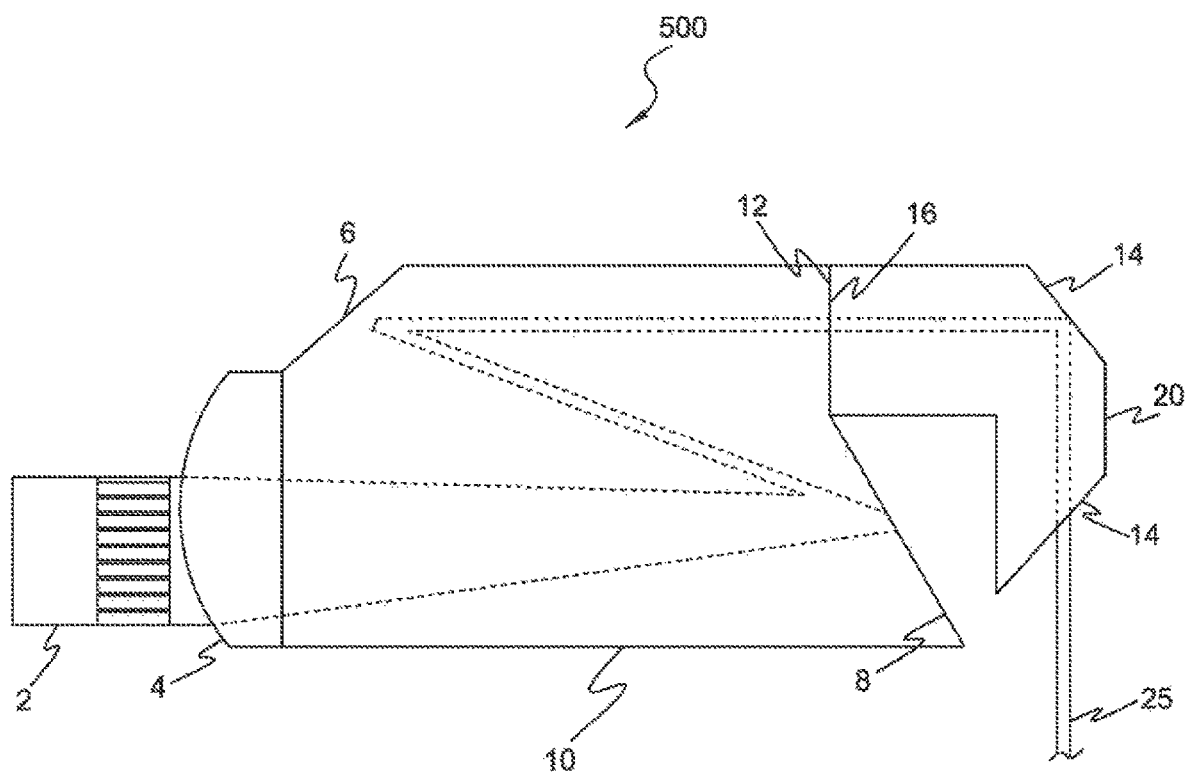
FIG. 5 illustrates a non-free space WBC module where the source of the input beams is abutted against the input surface of the combining module.

FIG. 5 illustrates another directly coupled system 500 having emitters 2 directly coupled into combining module 10. The combining optic 4 is formed at a distance away from the input surface.

Additional optical surfaces/elements may be formed into the combining modules such as a chief-ray collimation optic which may help to enable the output to be co-boresighted. A co-boresighted system is important for many applications such as various spectroscopy systems including: conventional absorption spectroscopy of trace chemical and biological agents, improvised explosive detection, differential absorption lidar (DIAL), and multi-wavelength photoacoustic spectroscopy, material verification, anti-counterfeiting, and threat screening.

FAC and SAC optics as well as beam rotating or repositioning surfaces may be formed therein as well. In some embodiments the facets of the combining module may have optical surfaces formed therein such as add a reflecting layer/coating or forming a dispersive element such as grating therein.

Control Electronics and Software

In some embodiments, control electronics and software may be used to apply current to the individually addressable QCL array and operate the DMD chip as required for the electronic wavelength tuning. In such embodiments, the QCLs may operate under pulsed operation, operated by a pulsed QCL driver. In some embodiments, the control software may have wavelength sweep modes, ramp modes, and/or any other modes commonly used in the art.

In at least one embodiment, coarse wavelength tuning may be accomplished by switching the specific QCL of interest in the array. In additional embodiments, fine wavelength tuning may be accomplished by adjusting the DMD mirror corresponding to that particular device. By adjusting the DMD mirror, electrical power may be applied to all elements of the QCL array constantly, and wavelength tuning may be accomplished by adjusting the DMD mirror for feedback to a single element within the QCL array.

Although the focus of this application has been on the MID-IR range, the principles may apply to wavelengths outside of those ranges that are determined by the emitters and gratings used.

The above description is merely illustrative. Having thus described several aspects of at least one embodiment of this invention including the preferred embodiments, it is to be appreciated that various alterations, modifications, and improvements may readily occur to those skilled in the art. Such alterations, modifications, and improvements are intended to be part of this disclosure, and are intended to be within the spirit and scope of the invention. Accordingly, the foregoing description and drawings are by way of example only.

The invention claimed is:

1. A method of forming a multi-wavelength beam, the method comprising:
    emitting, from a plurality of beam emitters, a plurality of input optical beams into a non-free-space optical module, each beam emitter emitting at an emission wavelength;
    transmitting the plurality of input optical beams to a diffraction grating;
    combining the plurality of input optical beams into a multi-wavelength beam at the diffraction grating;
    transmitting the multi-wavelength beam to a reflector; and
    at the reflector, (i) transmitting a first portion of the multi-wavelength beam, and (ii) reflecting a second portion of the multi-wavelength beam, thereby causing transmission of the second portion of the multi-wavelength beam through the non-free-space optical module back to the plurality of beam emitters, whereby the beam emitters are each stabilized to its emission wavelength.

2. The method of claim 1, further comprising converging the plurality of input optical beams toward the diffraction grating.

3. The method of claim 2, wherein the plurality of input optical beams is converged with an optic spaced away from a surface of the non-free-space optical module.

4. The method of claim 2, wherein the plurality of input optical beams is converged with an optic disposed on a surface of the non-free-space optical module.

5. The method of claim 1, wherein the diffraction grating is disposed on a surface of the non-free-space optical module.

6. The method of claim 1, wherein the diffraction grating is disposed within the non-free-space optical module.

7. The method of claim 1, wherein the reflector is disposed on a surface of the non-free-space optical module.

8. The method of claim 1, wherein each of the beam emitters is a diode emitter disposed within a diode bar.

9. The method of claim 1, wherein at least a portion of the non-free-space optical module comprises a material selected from the group consisting of glass, silica, sapphire, $CaF_2$, $MgF_2$, and ZnSe.

10. The method of claim 1, wherein each of the beam emitters emits into an optical fiber.

11. The method of claim 1, further comprising collimating the input optical beams.

12. The method of claim 11, wherein the input optical beams are collimated with a collimation optic disposed on a surface of the non-free-space optical module.

13. The method of claim 1, further comprising rotating and/or repositioning the input optical beams within the non-free-space optical module.

14. The method of claim 1, wherein the input optical beams are internally reflected one or more times within the non-free-space optical module.

15. The method of claim 1, wherein each beam emitter emits at a different emission wavelength.

16. The method of claim 1, wherein at least one beam emitter emits infrared radiation.

17. The method of claim 1, wherein at least one beam emitter emits ultraviolet radiation.

18. The method of claim 1, wherein at least one beam emitter emits visible radiation.

19. The method of claim 1, further comprising cooling the non-free-space optical module.

20. The method of claim 1, wherein the beams do not traverse free space between the non-free-space optical module and the reflector.

* * * * *